(12) United States Patent
Kanamori

(10) Patent No.: US 8,008,705 B2
(45) Date of Patent: Aug. 30, 2011

(54) SEMICONDUCTOR STORAGE DEVICE AND METHOD OF MANUFACTURING SAME

(75) Inventor: Kohji Kanamori, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 513 days.

(21) Appl. No.: 11/194,561

(22) Filed: Aug. 2, 2005

(65) Prior Publication Data
US 2006/0027853 A1    Feb. 9, 2006

(30) Foreign Application Priority Data

Aug. 9, 2004  (JP) .................... 2004-232339

(51) Int. Cl.
*H01L 29/788* (2006.01)
(52) U.S. Cl. . 257/316; 257/314; 257/315; 257/E29.129; 257/E29.134; 257/E29.136; 438/257
(58) Field of Classification Search .............. 257/315, 257/E29.129, 314, 316, E29.134, E29.136; 438/257
See application file for complete search history.

(56) References Cited

U.S. PATENT DOCUMENTS

| | | | | |
|---|---|---|---|---|
| 5,640,345 A | * | 6/1997 | Okuda et al. | 365/184 |
| 6,150,281 A | * | 11/2000 | Kwean | 438/724 |
| 6,512,263 B1 | * | 1/2003 | Yuan et al. | 257/316 |
| 6,653,183 B2 | * | 11/2003 | Hung et al. | 438/211 |
| 6,753,226 B2 | * | 6/2004 | Tsugane et al. | 438/258 |
| 6,809,373 B2 | | 10/2004 | Nishizaka | |
| 6,858,491 B1 | * | 2/2005 | Kokubun | 438/243 |
| 7,148,104 B2 | * | 12/2006 | Ding | 438/257 |
| 2003/0103382 A1 | | 6/2003 | Kobayashi | |
| 2003/0235952 A1 | | 12/2003 | Shibata | |
| 2004/0099900 A1 | | 5/2004 | Iguchi et al. | |

FOREIGN PATENT DOCUMENTS

| | | |
|---|---|---|
| JP | 2003-168748 | 6/2003 |
| JP | 2003-249575 | 9/2003 |
| JP | 2004-71646 | 3/2004 |
| JP | 2004-172488 | 6/2004 |
| JP | 2005-051227 | 2/2005 |

OTHER PUBLICATIONS

Japanese Office Action dated Jun. 7, 2011 (with a partial English translation).

* cited by examiner

*Primary Examiner* — Ken A Parker
*Assistant Examiner* — John Lin
(74) *Attorney, Agent, or Firm* — McGinn IP Law Group, PLLC

(57) ABSTRACT

Disclosed is a semiconductor storage device having a trench around a bit-line diffusion region in an area of a p-well, which constitutes a memory cell area, that is not covered by a word line and a select gate that intersects the word line. An insulating film is buried in the trench.

18 Claims, 7 Drawing Sheets

SEMICONDUCTOR STORAGE DEVICE AND METHOD OF MANUFACTURING SAME

FIELD OF THE INVENTION

This invention relates to a semiconductor storage device and, more particularly, to a rewritable non-volatile storage device and method of manufacturing the same.

BACKGROUND OF THE INVENTION

A structure of the kind shown in FIG. 6 has been proposed in the specification of Japanese Patent Kokai Publication No. JP-P2004-71646A (referred to as "Patent Document 1" below) as a non-volatile semiconductor storage device. In this non-volatile semiconductor storage device, as shown in FIG. 6, a channel is formed between an n+ diffusion region (also referred to as a heavily doped n+ region or n+ region) 107 and a buried diffusion region (layer) 121, and electric charge is captured in a storage node of an ONO film (stacked insulating films obtained by building up an oxide film, nitride film and oxide film in the order mentioned) on both sides of the cell, whereby it is possible to write, read and erase 2-bit information per cell independently. In FIG. 6, reference numeral 101 denotes a zone of memory cell diffusion region (p-well) (refereed to as a memory cell area), 103 a select gate and 111 a word line that intersects the select gate 103 and is disposed on the select gate 103 via an insulating film. Reference numeral 116 denotes a bit line of a first metallic interconnect layer (aluminum interconnect layer). Further, bank selection units 200A and 200B are located on both sides of the memory cell region. The select gates 103 extend alternatingly from one side of the memory cell area and from the opposite side of the memory cell area toward the opposing side.

[Patent Document 1]
 Japanese Patent Kokai Publication No. JP-P2004-71646A

SUMMARY OF THE DISCLOSURE

In a prior application (Japanese Patent Application No. 2003-275943, as yet undisclosed), the present applicant has proposed a structure in line with FIG. 6 with regard to a non-volatile semiconductor storage device adapted to inject electrons into a floating gate.

FIG. 7 is a diagram illustrating the layout in the vicinity of a contact of the n+ diffusion region 107 that forms a bit line in the non-volatile semiconductor storage device shown in FIG. 6, and FIG. 8 is a diagram schematically illustrating a cross section of FIG. 7 taken along line A-A'. As shown in FIGS. 7 and 8, the surface of the p-well is exposed adjacent the n+ diffusion region (also referred to as a "bit-line diffusion region") 107. Accordingly, in a case where a metal silicide has been formed in the contact region of the n+ diffusion region 107 under these conditions, PN shorting will arise. In other words, a silicide process cannot be used.

Even if a silicide process is not employed, there are instances where PN shorting still occurs owing to misalignment or the like when the contact is formed in the n+ diffusion region 107. The advance of miniaturization in the manufacturing process is accompanied by severe limitation in terms of positional deviation.

According to a first aspect of the present invention, there is provided a semiconductor storage device having a trench isolation in a second-conductivity-type diffusion region around a first-conductivity-type diffusion region, which constitutes a bit line, at a location in a memory cell area, not covered by a word line and a select gate that intersects the word line.

A semiconductor storage device according to the present invention comprises a plurality of first-conductivity-type diffusion regions extending in parallel with one another along one direction on a well surface comprising a second-conductivity-type diffusion region; a gate electrode, which extends along the one direction and is disposed on a substrate via an insulating film, between two mutually adjacent ones of the first-conductivity-type diffusion regions; and a word line extending along a direction perpendicular to the one direction and three-dimensionally intersecting the gate electrode; wherein an area of the well not covered by the gate electrode and word line is provided with a trench around the first-conductivity-type diffusion region within the area, an insulating film being buried in the trench.

According to another aspect of the present invention, there is provided a method of manufacturing a semiconductor storage device comprising the steps of: forming a trench by self-alignment in a second-conductivity-type diffusion region around a first-conductivity-type region which constitutes a bit line, at a location in a memory cell area, not covered by a word line and a select gate that intersects the word line; and covering the trench by an insulating film.

In accordance with the present invention, a region around a bit-line diffusion region is subjected to isolation by a trench formed by self-alignment using a word line and a select gate as a mask. As a result, the occurrence of PN shorting at the time of contact formation is positively avoided and reliability improved.

Further, according to the present invention, a trench is formed by self-alignment. Manufacture can be facilitated and simplified while precision is assured.

Still other effects and advantages of the present invention will become readily apparent to those skilled in this art from the following detailed description in conjunction with the accompanying drawings wherein only the preferred embodiments of the invention are shown and described, simply by way of illustration of the best mode contemplated of carrying out this invention. As will be realized, the invention is capable of other and different embodiments, and its several details are capable of modifications in various obvious respects, all without departing from the invention. Accordingly, the drawing and description are to be regarded as illustrative in nature, and not as restrictive.

PREFERRED EMBODIMENTS OF THE INVENTION

Figure 1:
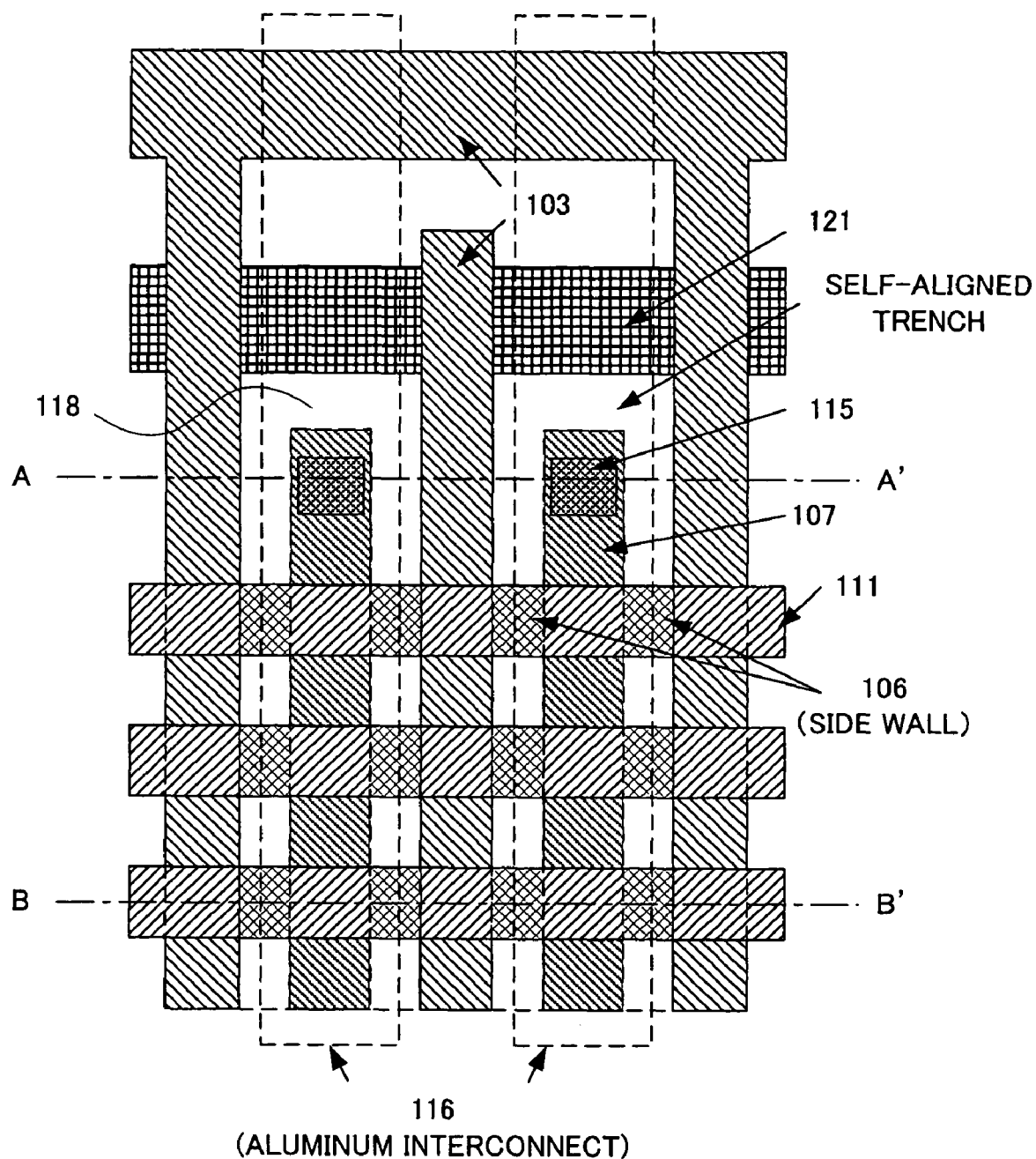
FIG. 1 is a diagram illustrating the structure of a semiconductor storage device according to an embodiment of the present invention.

An embodiment of the present invention will now be described in detail with reference to the drawings.

A semiconductor storage device according to the present invention comprises a plurality of first-conductivity-type diffusion regions (107 in FIG. 1), each of which constitutes a bit line, extending in parallel with one another along one direction on the surface of a second-conductivity-type diffusion region that constitutes a memory cell area, and a select gate (103 in FIG. 1), which extends along the one direction and is disposed on a substrate, in a gap between two mutually adjacent ones of the first-conductivity-type diffusion regions. At the intersection of a word line (111 in FIG. 1) and the select gate, floating gates (106 in FIG. 1) are provided on the substrate via an insulating film on both sides of side walls of the select gate. The plurality of first-conductivity-type diffusion regions are connected from prescribed areas thereof to upper-layer interconnect (116 in FIG. 1) by contacts. With regard to both ends or one end of the plurality of first-conductivity-type diffusion regions along the longitudinal direction thereof, a diffusion layer (121 in FIG. 1) is disposed along a direction perpendicular to the one direction at a position spaced away from the ends or end of the diffusion region. An area of the well surface where it is not covered by the select gate and word line is provided with a trench (118 in FIG. 1) around the first-conductivity-type diffusion region. The trench is covered by an insulating film to form a trench isolation.

Figure 2:
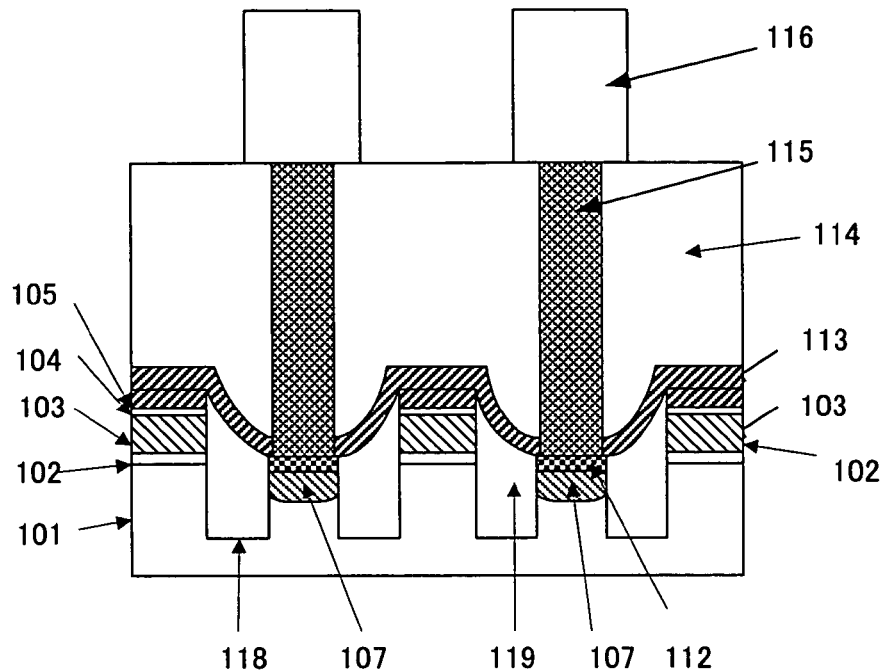
FIG. 2 is a sectional view taken along line A-A' of FIG. 1.
Figure 3:
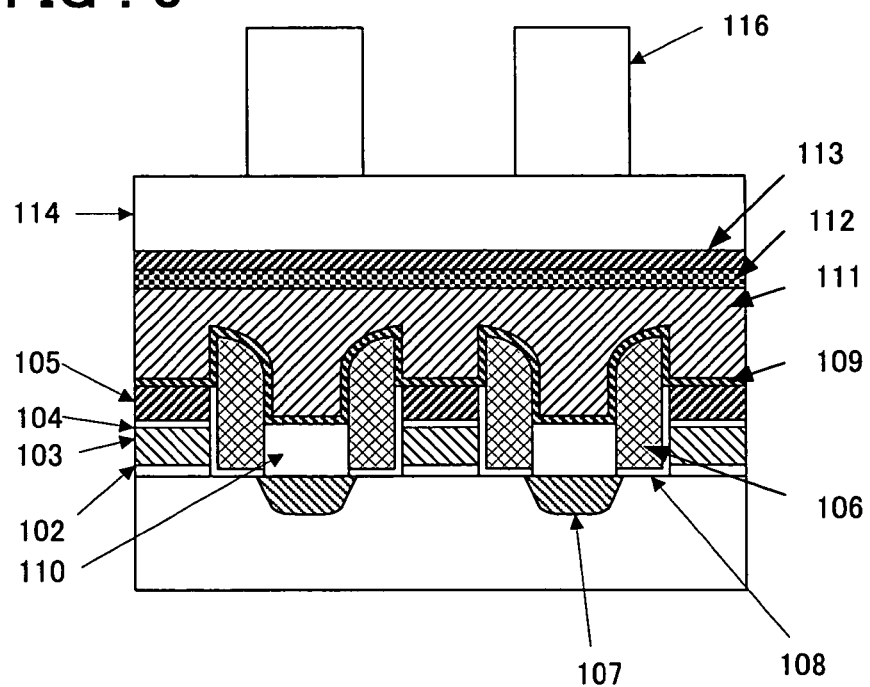
FIG. 3 is a sectional view taken along line B-B' of FIG. 1.

FIG. 1 is a plan view illustrating the structure of the semiconductor storage device according to this embodiment of the present invention, FIG. 2 is a cross sectional view taken along line A-A' of FIG. 1, and FIG. 3 is a cross sectional view taken along line B-B' of FIG. 1. The overall structure of the semiconductor storage device of this embodiment is assumed to be substantially similar to that shown in FIG. 6.

As shown in FIG. 1, the semiconductor storage device according to this embodiment includes a plurality of mutually spaced apart n+ diffusion regions 107, each of which constitutes a local bit line, extending in parallel with one another along one direction on a p-well surface (101 in FIG. 6) that constitutes a memory cell area, and a select gate 103, which extends along the one direction and is disposed on a substrate via an insulating film, in a gap between two mutually adjacent ones of the n+ diffusion regions 107. The plurality of n+ diffusion regions 107 are connected from prescribed contacts 115 thereof to corresponding bit lines 116 of a first aluminum interconnect layer. The semiconductor storage device further includes a buried diffusion region 121 (also referred to as a "common diffusion region") disposed in the substrate at a position spaced away from both ends or from one end of the plurality of n+ diffusion regions 107 along the longitudinal direction thereof and extending along a direction perpendicular to the first direction.

Figure 6:
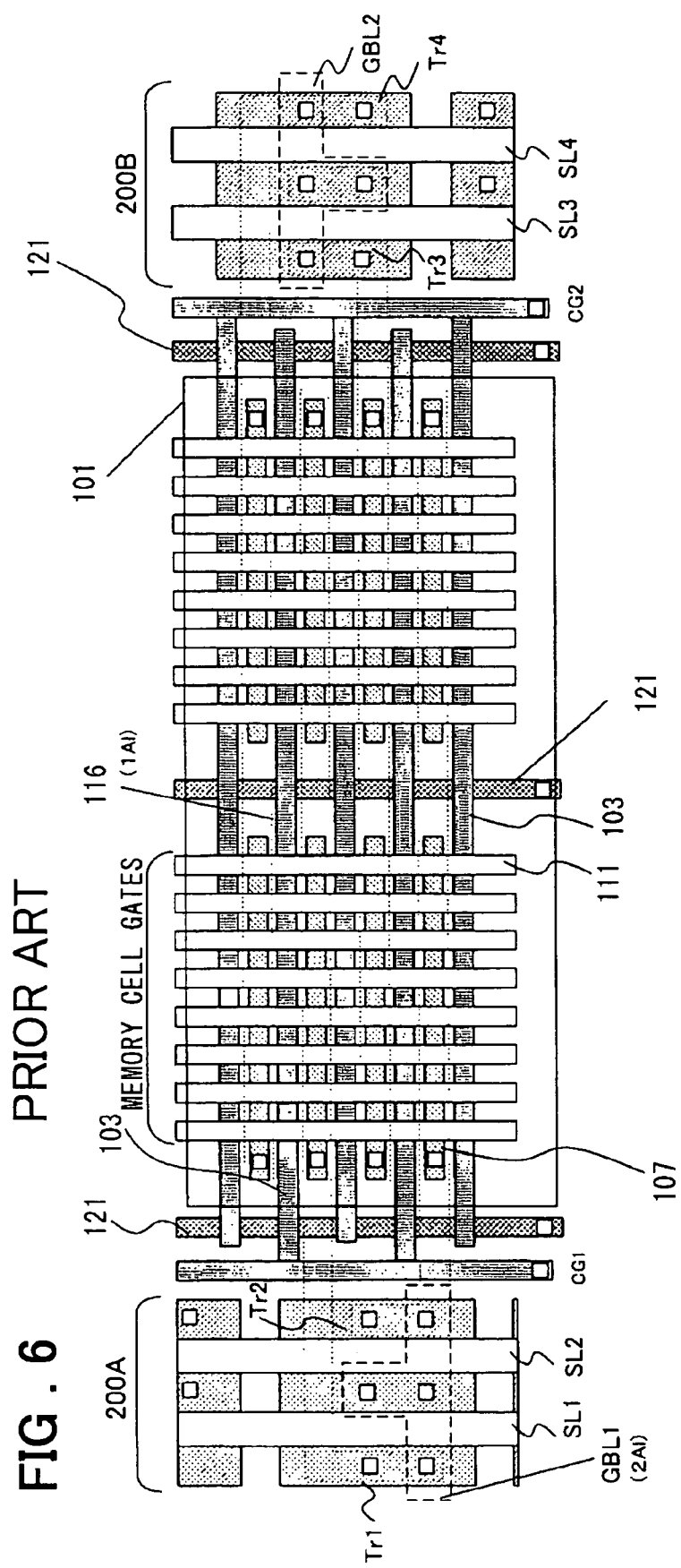
FIG. 6 is a diagram illustrating the layout of a semiconductor storage device according to the prior art.
Figure 7:
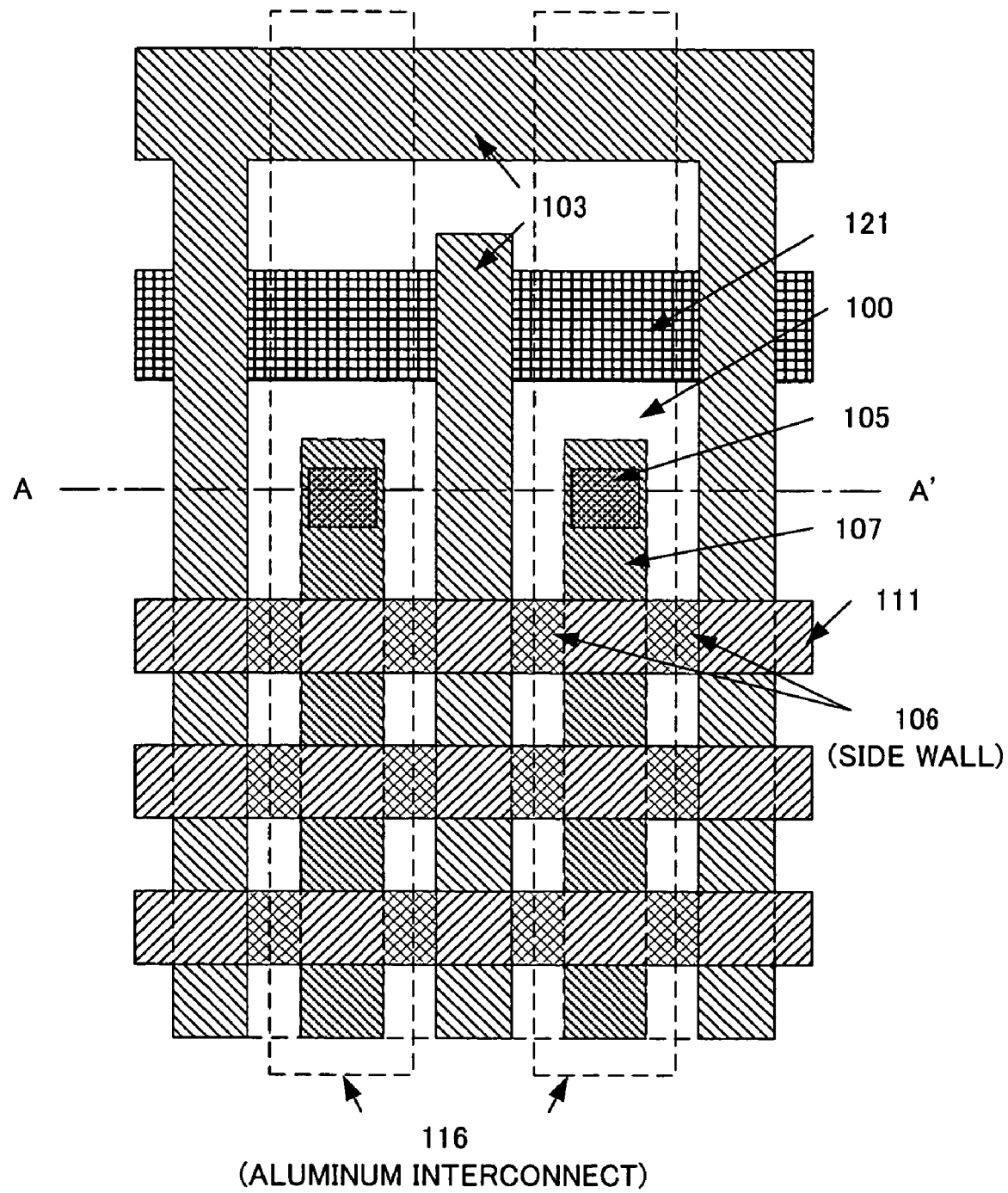
FIG. 7 is an enlarged view of the layout of FIG. 6.
Figure 8:
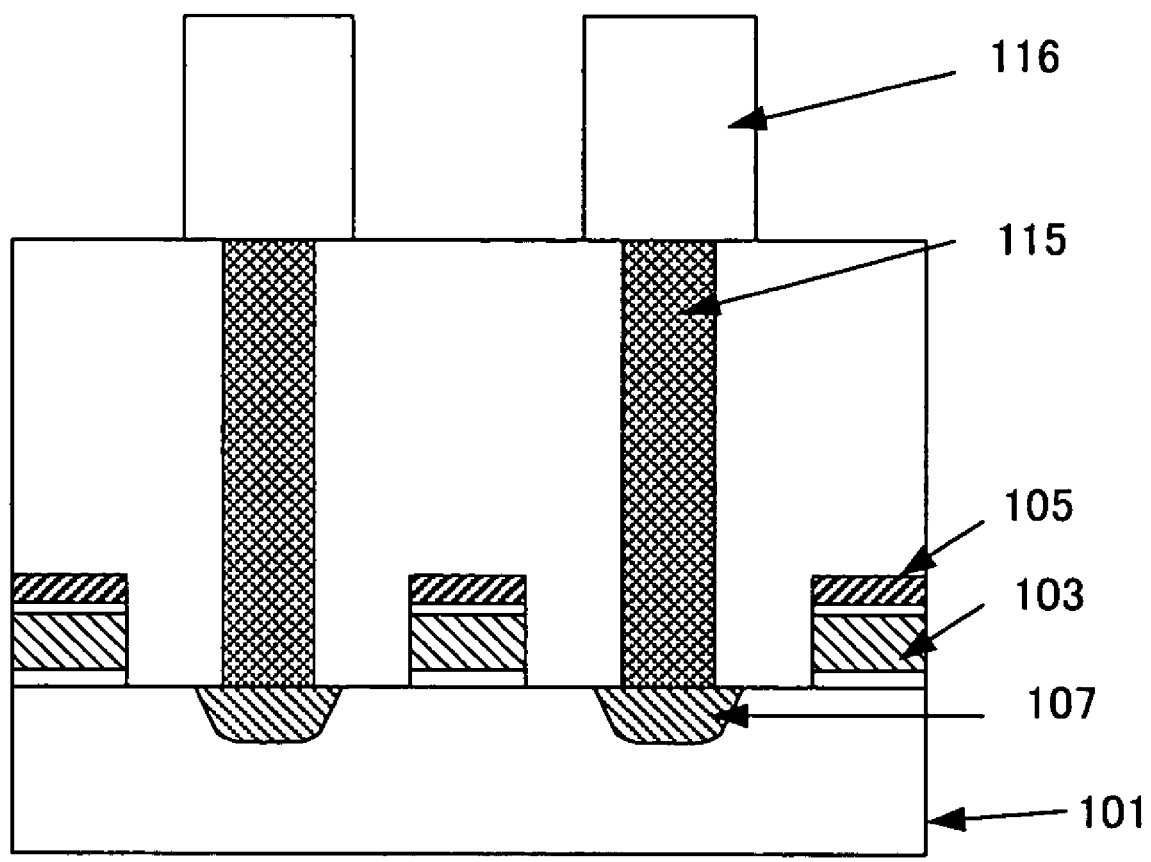
FIG. 8 is a sectional view taken along line A-A' of FIG. 7.

The select gate 103 intersects the buried diffusion region 121 via an insulating film and the end thereof protrudes beyond the side edge of the buried diffusion region 121. As shown in FIG. 6, the select gates 103 extend alternatingly from one side of the memory cell area and from the opposite side of the thereof toward the opposing side.

At the intersection of the select gate 103 provided between two n+ diffusion regions 107 and a word line (control gate electrode) 111, a floating gate 106 is provided on both sides of side walls of the select gate 103.

In this embodiment, the semiconductor storage device has a trench 118 around the n+ diffusion region 107 in the p-well of the memory cell area at a location not covered by the select gate 103 and word line 111. The trench 118 is covered by an insulating film to form a trench isolation.

Although the buried diffusion region 121 is formed in the substrate in advance, the present invention is not specifically limited to such an arrangement. For example, instead of the buried diffusion region 121, a diffusion region may be formed at the same location by ion-implanting and diffusing impurities in the substrate surface by self-alignment using the select gate as a mask. Further, the buried diffusion region 121 need not be a single region but may be separated into a plurality of regions. Furthermore, separated diffusion layers may be connected to one another via contacts and via the upper-layer interconnection to thereby lower resistance.

As shown in FIG. 2, the surface of the p-well 101 is provided with the trench 118 between the n+ diffusion region 107 and select gate 103 along the direction in which the n+ diffusion region 107 and select gate 103 are disposed. An insulating film 119 is buried in the trench 118.

By virtue of this arrangement, the periphery of the diffusion region 107 is covered by the insulating film 119, which consists of a material such as silicon dioxide, in a case where metal silicide (cobalt silicide) 112 is formed on the exposed surface of the n+ diffusion region 107. Since the p-well surface 101 is not exposed, PN shorting is positively avoided.

Further, even in a case where metal silicide is not used, PN shorting owing to misalignment (positional deviation of contacts) is positively avoided when the contacts are formed.

A nitride film 113 that covers the select gate 103 and the insulating film 119 filling the trench 118 functions as an etching stopper at the time of contact-hole formation owing to a selectivity that is different from that of the oxide film. As shown in FIG. 2, after an interlayer dielectric film 114 is formed on the nitride film 113, a contact hole is formed and is filled with a W plug or the like. The contact 115 is connected to the bit line 116 which is formed by patterning the first metal interconnect layer (aluminum interconnect layer) on the interlayer dielectric film 114.

With reference to FIG. 3 illustrating the cross section of the cell structure, the floating gate 106 is disposed on both sides of built-up layers of the select gate at the intersection between the word line (control gate electrode) 111 and select gate. More specifically, the select gate comprises the stacked layers consisting of an insulating film (oxide film) 102 provided on the substrate surface, a gate electrode 103 comprising a conducting member (polysilicon gate) disposed on the insulating film 102, an oxide film 104 disposed on the gate electrode 103 and a nitride film 105. An insulating film 108 (also referred to as a "tunnel insulating film") is provided on the substrate surface between the n+ diffusion region 107 and select gate and on the side wall of the select gate. The floating gate 106 is provided on the insulating film 108.

The space defined on the n+ diffusion region 107 by the floating gate 106 is filled with an insulating film 110. Furthermore, an insulating film [ONO film (stacked insulating films obtained by depositing an oxide film, nitride film and oxide film in the order mentioned)] 109 is provided covering the floating gate 106 and the upper part of the select gate laminate, and the word line 111 is formed on the insulating film 109. The bit line 116 (aluminum interconnect) is formed on the metal interconnect layer on the surface of the interlayer dielectric film 114 and is covered by an interlayer dielectric film (not shown). The n+ diffusion region 107 is formed by a well-known technique (self-alignment). Specifically, after the select gate is formed, the select gate and the substrate surface are covered by an oxide film (a tunnel oxide film), then polysilicon is deposited to form a side wall of the floating gate and ions of arsenic or the like are injected to form the region. Further, after the n+ diffusion region 107 is formed, the surface of the n+ diffusion region 107 is embedded with an oxide film, the surface of the oxide film is flattened and an etchback treatment is applied.

When data is written to the floating gate 106 of the cell having the structure shown in FIG. 3, a high voltage of about 9 V is applied to the word line 111, about 5 V is applied to the n+ diffusion region 107 serving as a drain, the n+ diffusion region 107 serving as the source is set to 0 V, and the select gate 103 is set to the approximate select-gate threshold-value voltage. When read operation is performed, about 5 V is applied to the word line 111, about 3 V is applied to the select gate 103, about 1.4 V is applied to the common diffusion region 121 of the select gate serving as a source, and the n+ diffusion region 107 serving as a source is made 0 V. For the details of cell write, read and erase, see the prior application (Japanese Patent Application No. 2003-275943, as yet undisclosed). In accordance with the present invention, a short circuit between the well and n+ diffusion region 107 when the contact of the n+ diffusion region 107 is formed is positively avoided. This contributes to an improvement in yield, the reliability of the device and the characteristics thereof.

An embodiment of a method of manufacturing the semiconductor storage device according to the present invention will now be described.

FIGS. 4A to 4D are diagrams useful in describing a method of manufacture according to this embodiment of the present invention. These cross sectional views, which are taken along line A-A' of FIG. 1, illustrate in order the principal portions of the manufacturing steps implemented when a trench is formed about the diffusion region of the p-well not covered by a word line and select gate.

Figure 4A:
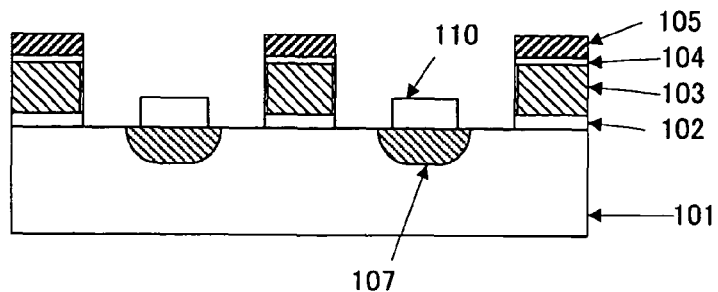
FIGS. 4A to 4D are sectional views useful in describing sequentially a method of manufacturing a semiconductor storage device according to the embodiment of the present invention.

As shown in FIG. 4A, the oxide film 110 is obtained by depositing the word line 111 in FIG. 3, depositing an oxide film over the entire surface of the substrate and then subjecting the word line to pattern formation by exposure and etching, thereby leaving the oxide film (110 in FIG. 3).

Figure 4B:
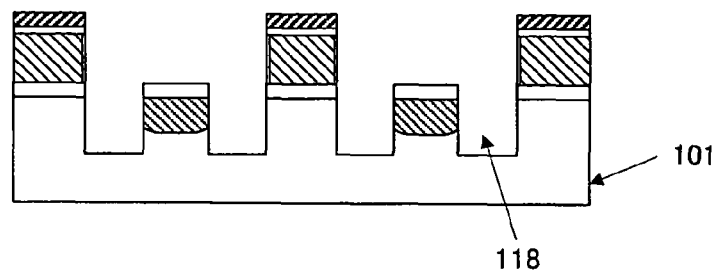

Next, as shown in FIG. 4B, by using the word line (not shown), the select gate (made up of the oxide film 102, polysilicon 103, oxide film 104 and nitride film 105) and the oxide film on the n+ diffusion region 107 as a mask, the trench (trench) 118 is formed through self-alignment by dry etching. It should be noted that the trench will be covered by an insulating film. Therefore, though not specifically defined, the trench 118 is formed so that its depth is below the bottom of the n+ diffusion region 107.

Figure 4C:
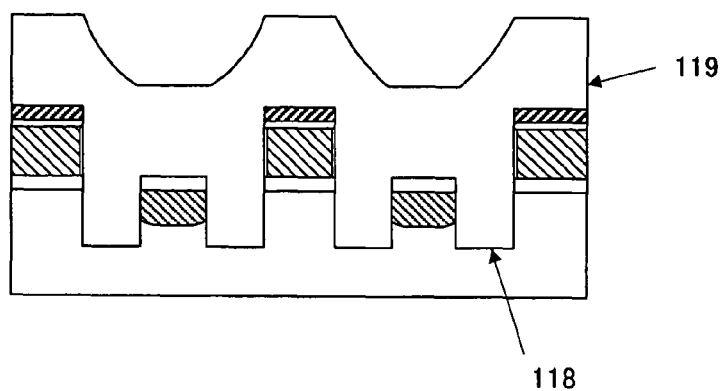

Next, as shown in FIG. 4C, the insulating film (oxide film) 119 is deposited by, e.g., CVD (Chemical Vapor Deposition) to fill the trench 118.

Figure 4D:
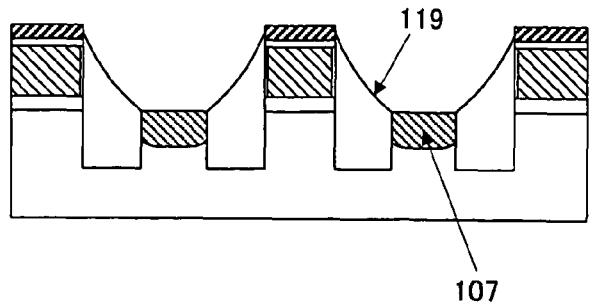

Next, as shown in FIG. 4D, the insulating film (oxide film) 119 is subjected to etchback to expose the surface of the n+ diffusion region 107 and the top of the select gate. Thus, the trench is formed and filled with the insulating film to thereby form the trench isolation.

Figure 5A:
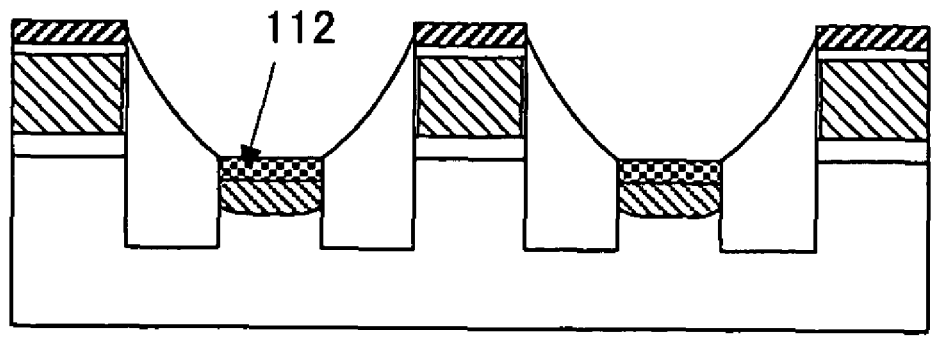
FIGS. 5A and 5B are sectional views useful in describing sequentially a method of manufacturing a semiconductor storage device according to the embodiment of the present invention.
Figure 5B:
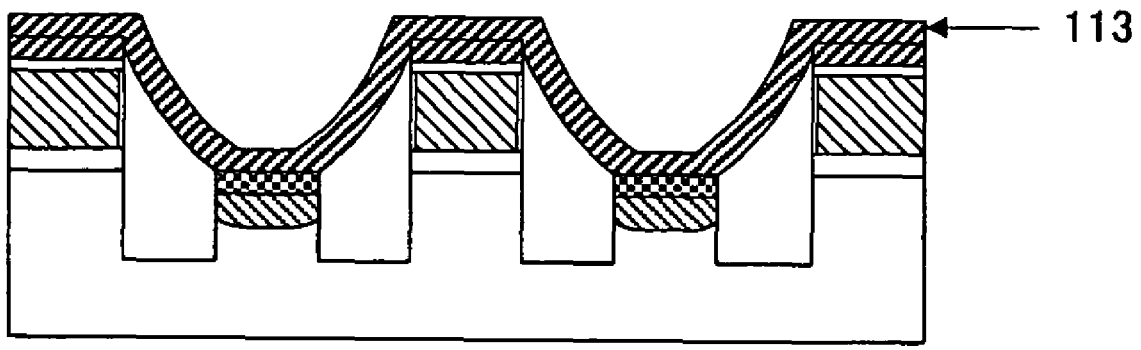

FIGS. 5A and 5B are cross sectional views taken along line A-A' of FIG. 1 and illustrate part of the manufacturing process from FIG. 4D onward. As shown in FIG. 5A, cobalt is deposited over the entire surface by sputtering or the like, a heat treatment is applied to form an alloy owing to reaction with silicon, and cobalt silicide is formed at least in the contact region of the n+ diffusion region 107. Since the periphery of the n+ diffusion region 107 has been covered by the insulating film 119, PN shorting will not occur in the silicide process.

Next, as shown in FIG. 5B, the nitride film 113 is deposited over the entire surface. It should be noted that the nitride film 113 is the same as the nitride film 113 in FIG. 3. Next, the interlayer dielectric film is deposited and flattened, after which a contact hole is formed and filled with a W plug or the like to form a contact. Further, aluminum is deposited and the aluminum is patterned to form a bit line, whereby the structure shown in FIG. 2 is obtained.

An example has been described in which the present invention is applied to a non-volatile semiconductor storage device having floating gates on both sides of a select gate, with two storage nodes being freely writable, readable and erasable independently owing to a pair of bit-line diffusion regions, which embrace the select gate between them, and a buried diffusion region. However, the present invention can of course be applied to a semiconductor storage device having any structure. That is, although the present invention has been described in line with the foregoing embodiment, it is not limited solely to the structure of the embodiment and various modifications and changes that would readily occur to one skilled in the art naturally fall within the scope of the present invention.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A semiconductor storage device comprising:
   a plurality of first-conductivity-type diffusion regions extending in parallel with one another along one direction on a surface of a well of a second conductivity type;
   a gate electrode extending along the one direction and being disposed on a substrate via a substrate insulating film between two mutually adjacent ones of said plurality of first-conductivity-type diffusion regions; and
   a word line extending along a direction perpendicular to said one direction and three-dimensionally intersecting said gate electrode,
   wherein an area of the well not covered by said gate electrode and said word line has a trench surrounding one of the plurality of first-conductivity-type diffusion regions within the area a trench insulating film being buried in said trench, and
   wherein said trench is formed between said one of the plurality of first-conductivity-type diffusion regions and said gate electrode such that said one of the plurality of first conductivity-type diffusion regions and said gate electrode respectively contact opposing surfaces of sidewalls of said trench.

2. The device according to claim 1, wherein said gate electrode and said substrate insulating film comprise a select gate,
   wherein, at an intersection of said word line and said select gate, on a side wall of said select gate, a floating gate is provided, and said word line is provided on said select gate and said floating gate via a word line insulating film,
   wherein a surface of said substrate has a common diffusion region of a first conductivity type disposed along a direction perpendicular to said one direction at a position spaced away from at least one longitudinal end of said plurality of first-conductivity-type diffusion regions, and
   wherein said plurality of first-conductivity-type diffusion regions are connected to corresponding ones of bit lines arranged in a metal interconnect layer by contacts.

3. The device according to claim 2, further comprising:
   silicided contact regions on a surface of said plurality of said first-conductivity-type diffusion regions.

4. The device according to claim 3, wherein a periphery of said plurality of said first-conductivity-type diffusion regions are covered by said trench insulating film, said trench insulating film comprising silicon dioxide,
   wherein said trench insulating film fills said trench, and
   wherein said silicided contact regions comprise metal silicide.

5. The device according to claim 4, wherein said metal silicide comprises cobalt silicide.

6. The device according to claim 4, further comprising:
   a nitride film covering said select gate and said substrate insulating film.

7. The device according to claim 6, wherein an interlayer dielectric film is formed on said nitride film, and
   wherein said interlayer dielectric film comprises said metal interconnect layer.

8. The device according to claim 1, wherein a bottom of said trench is formed below a bottom surface of said one of the plurality of first-conductivity-type diffusion regions.

9. The device according to claim 1, wherein said trench is formed parallel to said one of the plurality of first-conductivity-type diffusion regions.

10. The device according to claim 1, wherein said plurality of first-conductivity-type diffusion regions comprises a plurality of bit lines.

11. The device according to claim 1, wherein said well of said second conductivity type comprises a memory cell area.

12. The device according to claim 1, wherein said trench insulating film in said trench comprises a trench isolation.

13. The device according to claim 1, wherein said plurality of first-conductivity-type diffusion regions are connected to corresponding ones of bit lines arranged in a metal interconnect layer via an upper-layer interconnection.

14. The device according to claim 1, wherein said gate electrode is structurally separated from said word line.

15. The device according to claim 1, wherein said gate electrode three-dimensionally intersects a plurality of word lines comprising said word line.

16. The device according to claim 1, wherein said word line is unconnected to said gate electrode.

17. The device according to claim 1, wherein said one of the plurality of first conductivity-type diffusion regions and said gate electrode respectively contact said opposing surfaces of sidewalls of said trench at a plane extending along said direction perpendicular to said one direction.

18. A semiconductor storage device, comprising:
   a plurality of first-conductivity-type diffusion regions extending in parallel with one another along one direction on a surface of a well of a second conductivity type;
   a gate electrode extending along the one direction and being disposed on a substrate via a substrate insulating film between two mutually adjacent ones of said plurality of first-conductivity-type diffusion regions; and
   a word line extending along a direction perpendicular to said one direction and three-dimensionally intersecting said gate electrode,
   wherein an area of the well not covered by said gate electrode and said word line has a trench surrounding one of the plurality of first-conductivity-type diffusion regions within the area, a trench insulating film being buried in said trench,
   wherein said trench is formed between said one of the plurality of first-conductivity-type diffusion regions and said gate electrode such that said one of the plurality of first conductivity-type diffusion regions and said gate electrode contact a sidewall of said trench,
   wherein said gate electrode and said substrate insulating film comprise a select gate,
   wherein, at an intersection of said word line and said select gate, on a side wall of said select gate, a floating gate is provided, and said word line is provided on said select gate and said floating gate via a word line insulating film,
   wherein a surface of said substrate has a common diffusion region of a first conductivity type disposed along a direction perpendicular to said one direction at a position spaced away from at least one longitudinal end of said plurality of first-conductivity-type diffusion regions,
   wherein said plurality of first-conductivity-type diffusion regions arc connected to corresponding ones of bit tines arranged in a metal interconnect layer by contacts,
   wherein said select gate intersects said common diffusion region via a common insulating film, and
   wherein said select gate protrudes beyond a side edge of said common diffusion region.

\* \* \* \* \*